United States Patent [19]
Jung et al.

[11] Patent Number: 6,063,896
[45] Date of Patent: May 16, 2000

[54] COPOLYMER FOR PHOTORESIST

[75] Inventors: Jae Chang Jung; Cheol Kyu Bok, both of Ichon, Rep. of Korea

[73] Assignee: Hyundai Electronics Industries Co., Ltd., Ichon-shi, Rep. of Korea

[21] Appl. No.: 08/881,122

[22] Filed: Jun. 24, 1997

[30] Foreign Application Priority Data

Jun. 24, 1996 [KR] Rep. of Korea ................ 96-23281

[51] Int. Cl.$^7$ ............................ C08G 73/10; G03C 1/495
[52] U.S. Cl. ........................ 528/310; 528/322; 526/262; 526/279; 522/31; 522/32; 522/68; 522/152; 430/170; 430/193; 430/270
[58] Field of Search .................................... 526/262, 279; 430/270, 193, 170; 522/31, 32, 152, 68; 528/310, 322

[56] References Cited

U.S. PATENT DOCUMENTS

| | | | |
|---|---|---|---|
| 4,837,124 | 6/1989 | Wu et al. ................................ | 430/270 |
| 5,064,921 | 11/1991 | Blum et al. ............................. | 526/262 |
| 5,223,582 | 6/1993 | Blum et al. ............................. | 525/327 |
| 5,262,500 | 11/1993 | Chiang et al. .......................... | 526/262 |
| 5,397,680 | 3/1995 | Schädeli et al. ....................... | 430/271 |
| 5,585,220 | 12/1996 | Breyta et al. ........................... | 522/68 |

FOREIGN PATENT DOCUMENTS 0 301 520 A2  2/1989  European Pat. Off. .
2 121 807     1/1984  United Kingdom .

OTHER PUBLICATIONS

Yamada, Masamori, et al., "Syntheses and polymerizations of unsaturated dibasic acid derivatives", chemical abstract No. 72:212964 Kobunshi Kagaku 26(292) pp. 593–601 (1969) (Fukui University, Fukui, Japan).

*Primary Examiner*—P. Hampton-Hightower
*Attorney, Agent, or Firm*—Jacobson, Price, Holman & Stern, PLLC

[57] ABSTRACT

A copolymer of maleimide derivative and acrylic acid, represented by Formula I, is of high etch resistance and thermal resistance and can be used for photoresist in sub-microlithography.

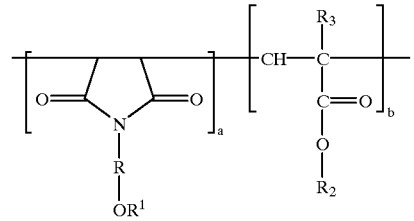

14 Claims, No Drawings

COPOLYMER FOR PHOTORESIST

BACKGROUND OF THE INVENTION

1. Field of the Invention

The present invention relates, in general, to a novel copolymer for photoresist and, more particularly, to a copolymer of maleimide derivative and acrylic acid, which is of high etch resistance and thermal resistance and can be used for photoresist in submicrolithography.

2. Description of the Prior Art

Certainly, the recent burst into the high integration of semiconductor devices is greatly dependent on the developmental progress of the techniques for forming fine patterns. For example, photoresist patterns are in general used as masks in etching or ion implantation and their fineness is, therefore, a very important factor in determining the degree of integration.

In this regard, a description will be given of conventional methods for forming fine photoresist patterns, below.

In an example, on a semiconductor substrate whose surface is rugged owing to an infrastructure formed therein is coated a photoresist solution made by dissolving a certain ratio of photoresist agent and resin in a solvent, to give a photoresist film.

Thereafter, a light beam is selectively illuminated upon the photoresist via a light screen pattern formed on a transparent substrate, to selectively polymerize the predetermined part of the photoresist film.

Then, the resulting semiconductor substrate is subjected to soft bake at 80–120° C. for 60–120 sec, followed by the development of the semiconductor substrate. For the development, a weak alkali solution consisting mainly of tetramethylammonium hydroxide (TMAH) is used to selectively remove the exposed/unexposed regions of the photoresist film.

Finally, the semiconductor substrate is washed with deionized water and dried, to obtain a photoresist pattern.

The resolution (R) of the photoresist pattern is proportional to the wavelength ($\lambda$) of the light source from a steper and to the process parameter (k) and inversely proportional to the numerical aperture (NA) of the steper, as represented by the following formula:

$$R = \frac{k \times \lambda}{NA}$$

Thus, in order to enhance the optical resolution of the steper, a light source with short wavelength may be employed. For example, G-line (436 nm) and i-line (365 nm) stepers have been developed but show limited process resolutions of about 0.7 and 0.5 $\mu$m, respectively.

In another example, rather than a mono-layer resist, a trilayer layer resist (hereinafter referred to as "TLR") which comprises two photoresist layers and an intermediate layer therebetween is used. Because the process parameter is small, this TLR process shows a more enhanced resolution by 30% than that obtainable in the mono-layer process, allowing the formation of the fine patterns 0.25 $\mu$m in size. But, the patterns as small as about 0.2 $\mu$m, necessary for the highly integrated semiconductor devices with a scale of 256 M or 1 G DRAM, are beyond this TLR process's ability.

In an effort to break such deadlock, a silylation process in which silicon is selectively injected onto photoresist was developed to lower the limit value of the resolution. This process is, however, complicated and poor in reproductivity.

For the formation of finer patterns smaller than 0.5 $\mu$m, a contrast enhancement layer (CEL) in which an additional thin film is formed on a wafer to enhance image contrast or a phase shift mask is used. However, the CEL process is found to be poor in production yield in addition to being complicated.

In the last decade, intensified research has been directed towards finding new light sources suitable to improve the resolution power. As a result, deep ultraviolet (DUV) rays were developed as light sources for the integration of semiconductor devices to 1 giga or higher scales. Now, the exposure process is prevailingly carried out in a steper using as a light source a KrF laser with a wavelength of 248 nm or an ArF laser with a wavelength of 193 nm. In fact, DUV is emerging as the simplest and strongest means, although there is an apparent limit in the recruitment of short wavelengths as a light source. In accordance with the development of the steper utilizing DUV, photoresist for DUV should be developed as well.

Typically, a photoresist for DUV is composed of aromatic polymer and photoacid generator, as represented by the following formula:

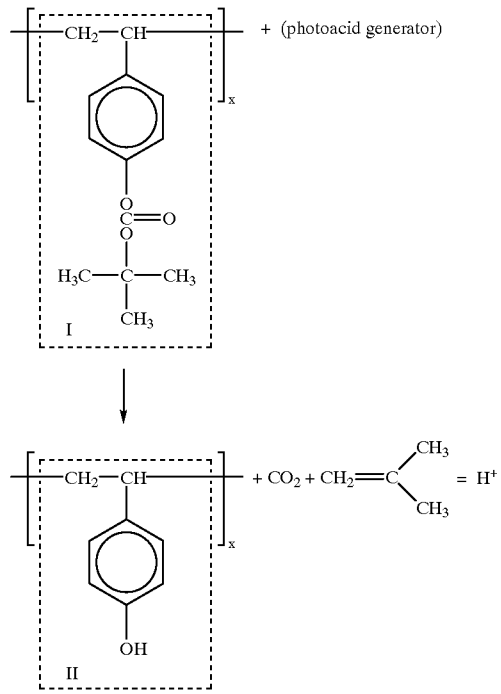

As seen in the formula, when the photoresist is exposed through a mask to uv light, the photoacid generator generates an acid ($H^+$) which subsequently reacts with resin I. As a result, resin I is decomposed into resin II, producing another acid ($H^+$) which can react, in chain, with another resin I.

While resin II is dissolved out by a developing solution, resin I, unaffected by acid, remains as it is. In this mechanism, a positive image patterned after the mask is formed on the substrate.

KrF, a light source in current use, has a wavelength of 248 nm but does not satisfy the needs for 4G DRAM. For the fine patterns of the much higher densities suitable for 4G DRAM, shorter wavelengths should be employed, and ArF light source 193 nm in wavelength is developed. In practice, however, there has not yet been developed a photoresist which can be applied for the lithography using the ArF light source. The reason is that aromatic resins, showing good etch resistance, are incompatible with the ArF light since aromatic resins absorb the light of 193 nm. The absorption of the light reduces the useful light which the photoacid generator can utilize.

As a result, most of the research concerning ArF photoresist are directed towards polymethylmetacrylate (PMMA) resins, which are represented by the following structural formula:

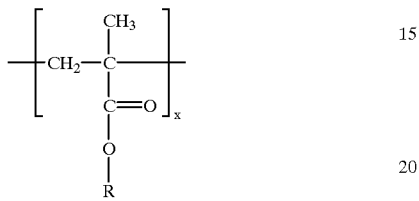

In contrast with aromatic resins, PMMA resins are poor in etch resistance and thermal resistance and thus, difficult to use in practice.

SUMMARY OF THE INVENTION

Intensive research repeated by the present inventors aiming to develop a PMMA photoresist for use in submicrolithography resulted in the finding that a copolymer of a maleimide derivative and an acrylic acid is much improved in etch resistance and thermal resistance in addition to lower absorption ArF light.

Therefore, it is an objective of the present invention to provide a polymer which is of high etch resistance and thermal resistance and useful for ArF photoresist.

In addition, objective of the present invention is to provide a polymer for photoresist which allows the formation of fine patterns with high resolution power and sensitivity.

DETAILED DESCRIPTION OF THE PREFERRED EMBODIMENT

The present invention contemplates for a polymer for photoresist, represented by the following structural formula:

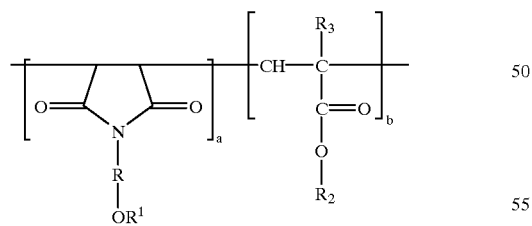

wherein,
R is a straight or branched alkyl group containing 0–30 carbon atoms;
$OR_1$ and $OR_2$ independently represent straight or branched alkoxy or cycloalkoxy groups containing 1–15 substituted or non-substituted carbon atoms;
$R_3$ independently represents hydrogen or an alkyl group; and
a and b, which may be the same or different, each are polymerization ratios ranging from 0 to 90.

As to R, there are alkyl groups represented by the following formula II:

R =

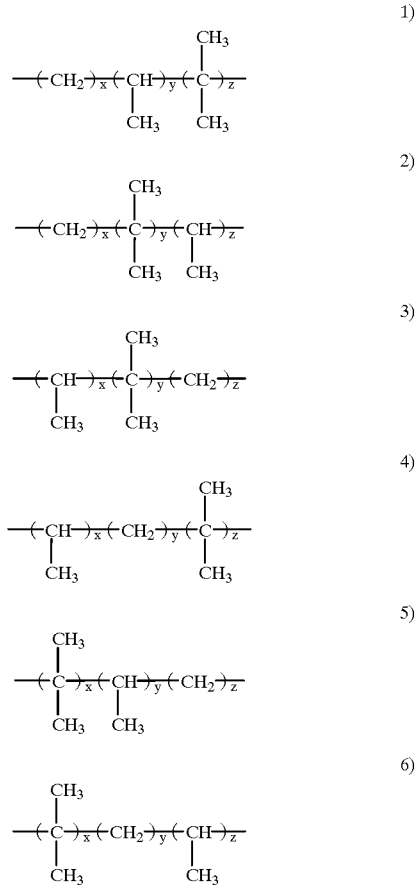

wherein, x, y and z, which may be the same or different, each are an integer of 0–5.

A more detailed explanation concerning $R_1$ and $R_2$ is represented by the following formula III:

$R_1, R_2 =$

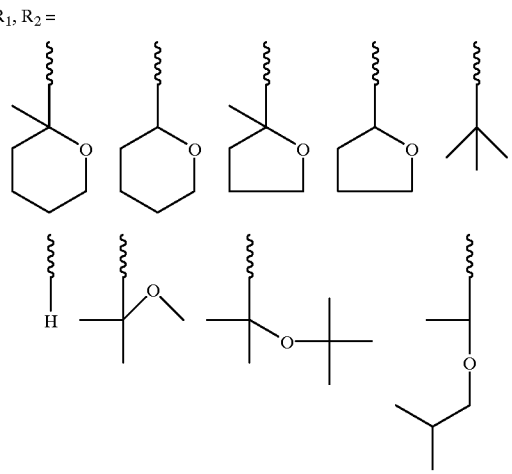

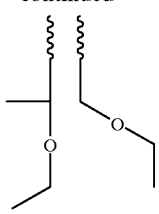

The polymerization ratios a and b, are determined by the amounts of the monomers added upon polymerization.

The novel copolymers of the present invention may be produced according to ordinary radical polymerization techniques using radical polymerization initiators.

They are polymerized in bulk polymerization or in a solution polymerization. For polymerization solvent, cyclohexanone, methylethylketone, benzene, toluene, dioxane, dimethylformamide alone or the combinations thereof may be used. Usually, the polymerization is carried out in the presence of a polymerization initiator, such as benzoylperoxide, 2,2'-azobisisobutyronitrile (AIBN), acetyl peroxide, lauryl peroxide, or t-butylperacetate.

In accordance with the present invention, various copolymers could be obtained from a pool of R groups of formula II and by selecting independent integers not more than 5 for x, y and z.

A better understanding of the present invention may be obtained in light of the following examples which are set forth to illustrate, but are not to be construed to limit the present invention. In the following examples, copolymers are prepared from maleimide derivatives and either acrylic acid derivatives or t-butyl acrylate derivatives.

EXAMPLE I 0.5 mole of 2-(t-butoxycarboylate)ethyl maleimide and 0.02–0.2 mole of acrylic acid were dissolved in dimethylformamide and reacted with each other at 60–70° C. for 4–24 hours in a nitrogen or argon atmosphere in the presence of 0.2–10 g of azobisisobutyronitrile (AIBN) serving as an initiator. The resin thus obtained was precipitated in ethyl ether or hexane and dried to produce poly(2-(t-butoxycarboxylate)ethyl maleimide/acrylic acid).

The copolymers obtained in this example can be represented by the formula II wherein R is selected from 1) and 2), x is 2, y and z are zero, and $R_1$ is a hydroxy group.

EXAMPLE II 0.5 mole of 3-(t-butoxycarboylate)propyl maleimide and 0.02–0.02 mole of acrylic acid were dissolved in dimethylformamide and reacted with each other at 60–70° C. for 4–24 hours in a nitrogen or argon atmosphere in the presence of 0.2–10 g of azobisisobutyronitrile (AIBN) serving as an initiator. The resin thus obtained was precipitated in ethyl ether or hexane and dried to produce poly(3-(t-butoxycarboxylate)propyl maleimide/acrylic acid).

The copolymers obtained in this example can be represented by the formula I wherein R is selected from 1) and 2), x is 2, y and z are zero, and $R_1$ is tertiary butyl.

EXAMPLE III 0.5 mole of 2-(t-butoxycarboylate)ethyl maleimide and 0.1–1 mole of t-butylacrylate were dissolved in dimethylformamide and reacted with each other at 60–70 C. for 4–24 hours in a nitrogen or argon atmosphere in the presence of 0.2–10 g of azobisisobutyronitrile (AIBN) serving as an initiator. The resin thus obtained was precipitated in ethyl ether or hexane and dried to produce poly(2-(t-butoxycarboxylate)ethyl maleimide/acrylic acid).

The copolymers obtained in this example can be represented by the formula II wherein R is selected from 1) and 2), x is 3, y and z are zero, and $R_1$ is hydroxy.

EXAMPLE IV 0.5 mole of 3-(t-butoxycarboylate)propyl maleimide and 0.1–1 mole of t-butylacrylate were dissolved in dimethylformamide and reacted with each other at 60–70° C. for 4–24 hours in a nitrogen or argon atmosphere in the presence of 0.2–10 g of azobisisobutyronitrile (AIEN) serving as an initiator. The resin thus obtained was precipitated in ethyl ether or hexane and dried to produce poly(2-(t-butoxycarboxylate)ethyl maleimide/acrylic acid).

The copolymers obtained in this example can be represented by the formula I wherein R is selected from 1) and 2), x is 3, y and z are zero, and $R_1$ is tertiary butyl.

A combination of the novel photoresist copolymers of Formula I with an ordinary photoacid generator in an organic solvent can be used for the formation of positive fine pictures.

Depending on photoacid generator and lithography conditions, the amount of the copolymer of the invention may usually range from about 5 to 40 a by weight based on the weight of the organic solvent used.

In preparing the photoresist composition, the $R_1$ and $R_2$ compounds of Formula I may be used as dissolution inhibitors.

A description will be given of a method of preparing photoresist from the copolymer of the invention, below.

First, the copolymer of the invention is dissolved at an amount of 10–30 % by weight in cyclohexanone, which is then added with a photoacid generator, such as an onium salt and organic sulfonate, at an amount of 0.1–10 % by weight based on the weight of the resist polymer. The photoresist solution is passed through an ultrafine filter and spin-coated on a silicon wafer to give a thin film which is then soft-baked for 1–5 min in an oven or hot plate of 80–150° C., exposed to light using a DUV steper or excimer laser steper and subjected to post-bake at 100–200° C. After the wafer exposed is immersed in a developing solution for about 90 seconds, ultrafine positive resist patterns can be obtained.

The photoresist prepared from the novel copolymer of the invention could be coated at a thickness of 1.0 μm or less by virtue of its excellent etch resistance and thermal resistance, giving satisfactory resolution and focus depth results.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A copolymer for a photoresist, represented by the following formula I:

$$\left[\begin{array}{c} \text{[structure with succinimide ring, N-R-OR}_1\text{]} \end{array}\right]_a \left[\begin{array}{c} \text{CH}-\text{C}(\text{R}_3) \\ | \\ \text{C}=\text{O} \\ | \\ \text{O}-\text{R}_2 \end{array}\right]_b$$

wherein,

R is a straight or branched alkyl group containing 0–30 carbon atoms;

$OR_1$ and $OR_2$ independently represent OH or straight or branched alkoxy or cycloalkoxy groups containing 1–15 substituted or nonsubstituted carbon atoms;

$R_3$ independently represents hydrogen or an alkyl group; and a and b, which may be the same or different, each are polymerization ratios ranging from 0 to 90.

2. A copolymer in accordance with claim 1, wherein said R is selected from the group consisting of:

R =

1) $-(CH_2)_x-(CH)_y-(C)_z-$ with CH$_3$ groups

2) $-(CH_2)_x-(C)_y-(CH)_z-$ with CH$_3$ groups

3) $-(CH)_x-(C)_y-(CH_2)_z-$ with CH$_3$ groups

4) $-(CH)_x-(CH_2)_y-(C)_z-$ with CH$_3$ groups

5) $-(C)_x-(CH)_y-(CH_2)_z-$ with CH$_3$ groups and

6) $-(C)_x-(CH_2)_y-(CH)_z-$ with CH$_3$ groups wherein, x, y and z, which may be the same or different, each are an integer of 0–5, and said $R_1$ and $R_2$ are independently selected from the group consisting of:

$R_1, R_2 =$

[structures: 2-methyltetrahydropyranyl, tetrahydropyranyl, 2-methyltetrahydrofuranyl, tetrahydrofuranyl, tert-butyl, H, tert-butoxymethyl, 1-ethoxyethyl-type, 1-isobutoxyethyl-type, 1-ethoxypropyl, 1-ethoxy variant, and another ether].

3. A copolymer in accordance with claim 1, wherein R is selected from the group consisting of:

R =

1) $-(CH_2)_x-(CH)_y-(C)_z-$ with CH$_3$ groups

2) $-(CH_2)_x-(C)_y-(CH)_z-$ with CH$_3$ groups

3) $-(CH)_x-(C)_y-(CH_2)_z-$ with CH$_3$ groups

4) $-(CH)_x-(CH_2)_y-(C)_z-$ with CH$_3$ groups

5) $-(C)_x-(CH)_y-(CH_2)_z-$ with CH$_3$ groups and

-continued

6)

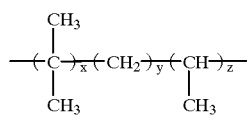

wherein OR₁ and OR₂ independently represent straight or branched alkoxy or cycloalkoxy groups containing 1–15 substituted or nonsubstituted carbon atoms.

4. A copolymer for a photoresist, wherein said copolymer consists of the sub units:

(a)

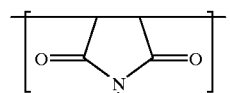

and (b)

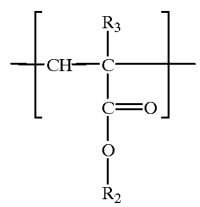

wherein,

R is a straight or branched alkyl group containing 0–30 carbon atoms;

OR₁ and OR₂ independently represent OH or straight or branched alkoxy or cycloalkoxy groups containing 1–15 substituted or nonsubstituted carbon atoms;

R₃ independently represents hydrogen or an alkyl group.

5. A copolymer in accordance with claim 4, wherein the molar ratio of (a) to (b) is between 2.5 and 25.

6. A copolymer in accordance with claim 4, wherein the molar ratio of (a) to (b) is between 0.5 and 5.

7. A copolymer in accordance with claim 5, wherein R is —(CH₂)₂—, and OR₁ is a hydroxy group.

8. A copolymer in accordance with claim 5, wherein R is —(CH₂)₃—, and R₁ is a tertiary butyl group.

9. A copolymer in accordance with claim 6, wherein R is —(CH₂)₂—, and OR₁ is a hydroxy group.

10. A copolymer in accordance with claim 6, wherein R is —(CH₂)₃—, and R₁ is a tertiary butyl group.

11. A photoresist composition comprising a photoacid generator and a copolymer; wherein the copolymer comprises the sub units:

(a)

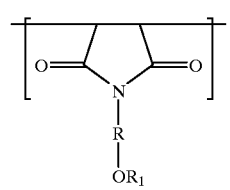

and (b)

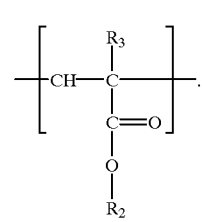

wherein,

R is a straight or branched alkyl group containing 0–30 carbon atoms;

OR₁ and OR₂ independently represent OH or straight or branched alkoxy or cycloalkoxy groups containing 1–15 substituted or nonsubstituted carbon atoms;

R₃ independently represents hydrogen or an alkyl group.

12. A photoresist composition in accordance with claim 11 wherein said R is selected from the group consisting of:

R =

1)

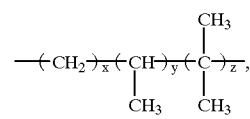

2)

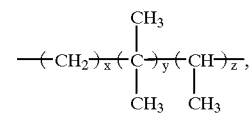

3)

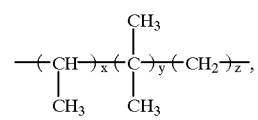

4)

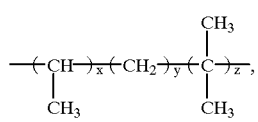

5)

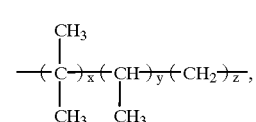

and

6)

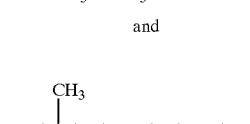

wherein x, y and z, which may be the same or different, each are an integer of 0–5, and said R₁ and R₂ are independently selected from the group consisting of:

R₁, R₂ =
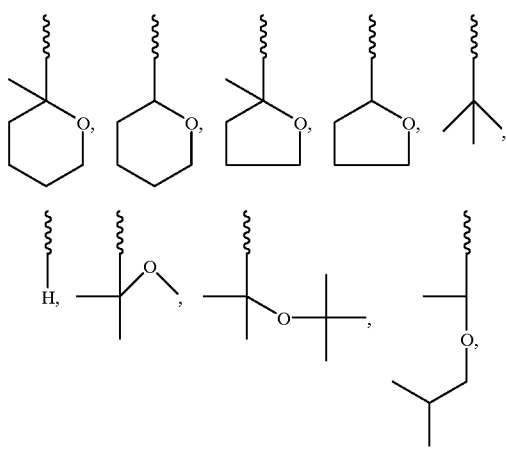
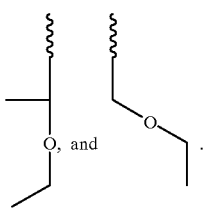
13. A copolymer in accordance with claim 12, wherein the molar ratio of (a) to (b) is between 2.5 and 25.
14. A copolymer in accordance with claim 12, wherein the molar ratio of (a) to (b) is between 0.5 and 5.
* * * * *